(12) United States Patent
Kato

(10) Patent No.: US 11,469,184 B2
(45) Date of Patent: Oct. 11, 2022

(54) SEMICONDUCTOR DEVICE AND MANUFACTURING METHOD OF THE SAME

(71) Applicant: KIOXIA CORPORATION, Tokyo (JP)

(72) Inventor: Satoshi Kato, Kuwana Mie (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 16/998,754

(22) Filed: Aug. 20, 2020

(65) Prior Publication Data

US 2021/0296250 A1 Sep. 23, 2021

(30) Foreign Application Priority Data

Mar. 23, 2020 (JP) ............................. JP2020-050831

(51) Int. Cl.
| | |
|---|---|
| *H01L 25/18* | (2006.01) |
| *H01L 21/48* | (2006.01) |
| *H01L 23/538* | (2006.01) |
| *H01L 25/065* | (2006.01) |
| *H01L 21/56* | (2006.01) |

(52) U.S. Cl.
CPC ...... *H01L 23/5389* (2013.01); *H01L 21/4853* (2013.01); *H01L 21/561* (2013.01); *H01L 23/5386* (2013.01); *H01L 25/0657* (2013.01); *H01L 25/18* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC ............ H01L 23/5389; H01L 23/5386; H01L 21/4853; H01L 21/561; H01L 25/0657; H01L 25/18; H01L 2225/06506; H01L 2225/0651; H01L 2225/06562; H01L 2225/06586

See application file for complete search history.

(56) References Cited

U.S. PATENT DOCUMENTS

| | | |
|---|---|---|
| 5,571,754 A | 11/1996 | Bertin et al. |
| 10,847,468 B2 | 11/2020 | Kim et al. |
| 2017/0170130 A1 | 6/2017 | Kaneda et al. |

FOREIGN PATENT DOCUMENTS

| | | | |
|---|---|---|---|
| JP | 2004281819 A | | 10/2004 |
| JP | 2008-235768 | * | 3/2007 |
| JP | 2010087295 A | | 4/2010 |
| TW | 201112384 A | | 4/2011 |
| TW | 201921620 A | | 6/2019 |
| TW | 202008546 A | | 2/2020 |

* cited by examiner

*Primary Examiner* — Timor Karimy
(74) *Attorney, Agent, or Firm* — Kim & Stewart LLP

(57) ABSTRACT

A semiconductor device includes a support, a semiconductor chip, a first insulating film, and a wiring layer. The support comprises a first electrode. The semiconductor chip has a first surface facing the support and a second surface facing away from the support with a second electrode thereon. The first insulating film has a first portion in contact with the first surface and a second portion in contact with at least one side surface of the semiconductor chip. The wiring layer connects the first electrode to the second electrode. The wiring layer is on the support, the second surface of the semiconductor chip, a side surface of the second portion of the first insulating film.

20 Claims, 10 Drawing Sheets

SEMICONDUCTOR DEVICE AND MANUFACTURING METHOD OF THE SAME

CROSS-REFERENCE TO RELATED APPLICATION(S)

This application is based upon and claims the benefit of priority from Japanese Patent Application No. 2020-050831, filed Mar. 23, 2020, the entire contents of which are incorporated herein by reference.

FIELD

Embodiments described herein relate generally to a semiconductor device and a manufacturing method of the same.

BACKGROUND

A logic semiconductor chip is mounted on a support, such as a wafer, and a wiring layer is formed to connect the semiconductor chip to the support. To prevent silicon exposed at a side wall of the chip from being electrically connected to the wiring layer, a method is known in which an insulating film is provided to cover the upper surface and side surfaces of the chip prior to formation of the wiring layer. However, if this insulating film is provided after the chip is mounted on the support/wafer, the mounted thickness of the chip including the insulating film may increase, and this may increase the total thickness of a semiconductor package that incorporates such semiconductor chip therein.

It would be preferable to reduce package sizes even when an insulating film is incorporated to prevent a side wall of a mounted chip from being electrically connected to a wiring layer.

DETAILED DESCRIPTION

According to one or more embodiments, a semiconductor device includes a support and a semiconductor chip. The support includes a first electrode thereon. The semiconductor chip has a first surface facing the support and a second surface facing away from the support. The semiconductor chip includes a second electrode on the second surface. A first insulating film has a first portion in contact with the first surface and a second portion in contact with at least one side surface of the semiconductor chip. A wiring layer connects the first electrode to the second electrode. The wiring layer is on the support, the second surface of the semiconductor chip, and a side surface of the second portion of the first insulating film.

Hereinafter, example embodiments will be described with reference to the drawings.

In this specification, multiple expressions and/or terms may be provided as descriptive examples for some elements or aspects. Such multiple expression examples are non-limiting and provided for purposes of explanation of certain possible examples only. Even when a plurality of expressions and/or terms are not used to describe an element or aspect in the specification, this does not intend to imply that other descriptive expressions and/or terms are not applicable to such an element or aspect.

The drawings are schematic diagrams in which a relationship between thickness and plane dimensions and thickness ratios of layers, and the like, may be different from actual ones. Some of the drawings may include portions different in dimensional relationship and ratio from equivalents in other drawings. In some depictions, certain elements or aspects may be omitted for explanatory convenience.

First Embodiment

Figure 1:
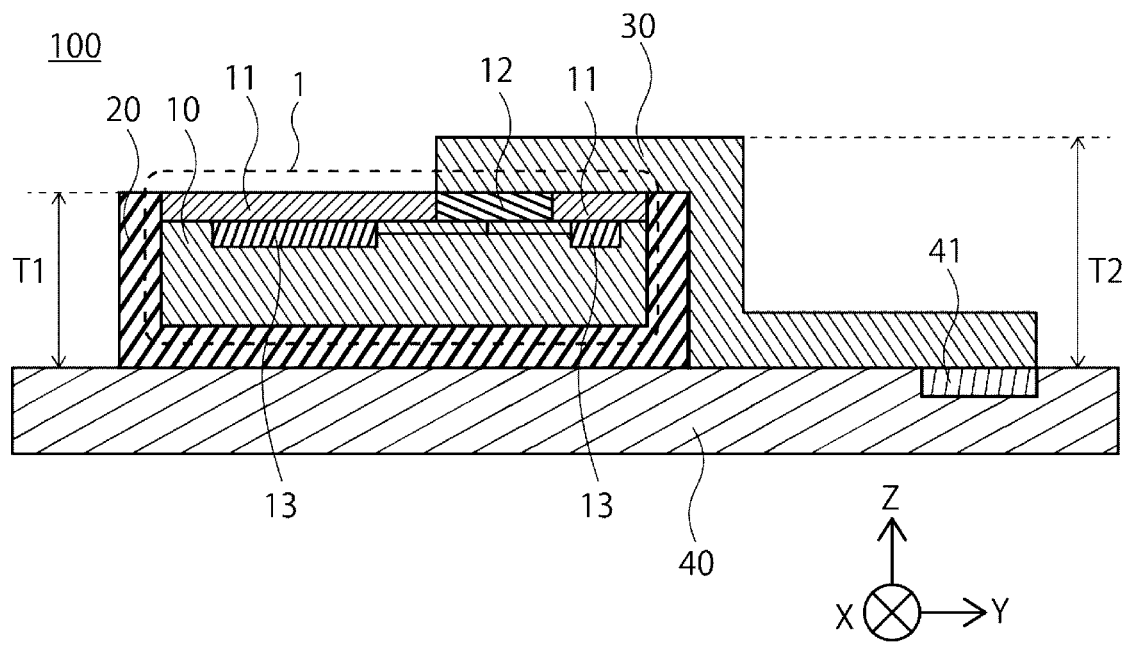
FIG. 1 depicts a semiconductor device in a conceptual cross-sectional view according to a first embodiment.

FIG. 1 is a conceptual cross-sectional view of a semiconductor device 100 according to the first embodiment. An example of the semiconductor device 100 is a semiconductor chip on which wiring has been partly formed. As another example, the semiconductor device 100 is part or a whole of a semiconductor package in which a semiconductor chip is mounted. In the present embodiment, an X direction, a Y direction, and a Z direction intersect one another and are perpendicular to one another.

The conceptual diagram of FIG. 1 illustrates part of the semiconductor device 100. The semiconductor device 100 in FIG. 1 includes a semiconductor chip 1, a first insulating film 20, a wiring layer 30, and a support 40. The support 40 includes an electrode 41 (may also be referred to as a "first electrode" in some contexts). The semiconductor chip 1 includes a semiconductor layer 10, semiconductor elements 13, a second insulating film 11, and an electrode 12 (may also be referred to as a "second electrode" in some contexts). Examples of the semiconductor elements 13 include CMOS circuits.

The semiconductor chip 1 is, for example, a logic chip. The semiconductor chip 1 may be a controller chip for a non-volatile memory chip.

The first insulating film 20 is formed on a first surface of the semiconductor chip 1 as well as side surfaces of the semiconductor chip 1. In this context, the first surface of the semiconductor chip 1 is the surface that faces the support 40. That is, the first surface of the semiconductor chip 1 corresponds to the downward facing surface in FIG. 1. The side surfaces of the semiconductor chip 1 are those surfaces that meet the first surface The portions of the first insulating film 20 on the first surface of the semiconductor chip 1 and the portions of the first insulating film 20 on the side surfaces of the semiconductor chip 1 are seamlessly connected and thus the first insulating film 20 is a continuous film. That is, the first insulating film 20 is uninterrupted from the side surfaces of the semiconductor chip 1 to the first surface of the semiconductor chip 1.

The semiconductor layer 10 is part of a semiconductor substrate. If the first insulating film 20 is not provided, then edges of the semiconductor layer 10 may be exposed at the side surfaces of the semiconductor chip 1. If silicon, for example, of the exposed portion of the semiconductor layer 10 comes into contact with the wiring layer 30, the semiconductor layer 10 may be inadvertently or undesirably electrically connected to the wiring layer 30. To insulate the semiconductor layer 10 at the side surfaces of the semiconductor chip 1 from the wiring layer 30, according to the first embodiment, the first insulating film 20 is provided such that the side surfaces of the semiconductor chip 1 are in direct contact with the first insulating film 20. In one embodiment, the entirety of the first surface of the semiconductor chip 1 that faces the support 40 and the entirety of the side surfaces of the semiconductor chip 1 are in direct contact with the first insulating film 20.

The second insulating film 11 and the electrode 12 are disposed on a second surface of the semiconductor chip 1. in this context, the second surface of the semiconductor chip 1 is the surface opposite of the first surface. That is, while the first surface faces the support 40, the second surface faces away from the support 40. The second surface of the semiconductor chip 1 is thus the upper surface in FIG. 1.

The second insulating film 11 covers at least part of a surface of the semiconductor layer 10 that faces away from support 40. The second insulating film 11 prevents the semiconductor layer 20 from being electrically connected to the wiring layer 30 other than at the location of electrode 12. In the present embodiment as shown in FIG. 1, at least part of the second insulating film 11 is in direct contact with the wiring layer 30. The second insulating film 11 is, for example, an inorganic film, such as an inorganic oxide film, an inorganic nitride film, and an inorganic oxynitride film. The inorganic film may be formed by, for example, oxidizing or nitriding silicon or by deposition such as CVD or sputtering. The second insulating film 11 may be an organic film of, for example, a polyimide. The organic film may be formed by a coating method such as spin coating and may have a film thickness of 1 µm to several µm. The inorganic film may have a thickness in the range of, for example, 10 nm to 100 nm. The second insulating film 11 may be an organic film and an inorganic film may be stacked on each other.

The electrode 12 is an external electrode of the semiconductor chip 1. A plurality of electrodes 12 may be disposed on the semiconductor chip 1. Each electrode 12 is made of metal, such as aluminum (Al), copper (Cu), or nickel (Ni) or alloys of such metals. The electrode 12 is electrically connected to the wiring layer 30. The electrode 12 is electrically connected to the semiconductor elements 13 of the semiconductor chip 1 by internal wiring.

As illustrated in FIG. 1, a plurality of semiconductor elements 13 are disposed in the semiconductor layer 10 and electrically connected to one another. The semiconductor elements 13 are electrically connected to the electrode(s) 12.

The first insulating film 20 insulates the semiconductor chip 1. The first insulating film 20 may be a resin film. In one embodiment, a die attach film (DAF) may be interposed between the first insulating film 20 and the support 40 to adhere the first insulating film 20 to the support 40. In another embodiment, the first insulating film 20 may be adhesive itself and can be adhered to the support 40. In order to reduce a thickness of a semiconductor package incorporating the semiconductor chip 1 therein, the first insulating film 20 located between the semiconductor chip 1 and the support 40 may be in direct contact with the support 40. The first insulating film 20 may contain adhesive resin. The first insulating film 20 may further contain a filler or the like.

Since the first insulating film 20 is a seamlessly continuous film, the portions of the first insulating film 20 that are in contact with the first surface of the semiconductor chip 1 and the portions of the first insulating film 20 that are in contact with the side surfaces of the semiconductor chip 1 are made of the same insulator material. For example, such portions are made of the same resin or of the same resin and the same filler.

The wiring layer 30 is electrically connected at least to the semiconductor chip 1 and disposed on the support 40. The wiring layer 30 may be electrically connected to the support 40 or may not be electrically connected to the support 40. In the conceptual diagram of FIG. 1, the semiconductor chip 1 is electrically connected to the support 40 via the wiring layer 30. The wiring layer 30 maybe in direct contact with the semiconductor chip 1, the first insulating film 20, and the support 40. In some cases, the wiring layer 30 extends further in the X direction.

The wiring layer 30 is formed of, for example, a copper (Cu) layer or a stacked body of a copper layer and an under layer containing titanium (Ti) or the like. When the wiring layer 30 is formed by plating, the wiring layer 30 may include an under layer (seed layer) for plating. The wiring layer 30 may be formed by combining deposition, such as sputtering, with photolithography.

The wiring layer 30 is in contact with: the second surface of the semiconductor chip 1, a surface of the first insulating film 20 disposed on at least one of the side surfaces of the semiconductor chip 1; and the support 40.

In another embodiment, the wiring layer 30 can be in contact with at least a part of the second surface of the semiconductor chip 1, all of first insulating film 20 that is on one of the side surfaces of the semiconductor chip 1, and the support 40. If an additional insulating film were to be interposed between the wiring layer 30 and the first insulating film 20, then the package may increase in thickness. In order to prevent an increase in thickness, no additional insulating film is interposed between the wiring layer 30 and the first insulating film 20 in this first embodiment. In the example of FIG. 1, the wiring layer 30 is in direct contact with the second insulating film 11, which may be an inorganic film.

In FIG. 1, a maximum distance from the support 40 to the semiconductor chip 1, that is a distance between a surface of the support 40 on which the semiconductor chip 1 is disposed and a surface of the semiconductor chip 1 farthest from the support 40, is denoted as distance T1. A maximum distance from the support 40 to the wiring layer 30, that is a distance between the surface of the support 40 on which the semiconductor chip 1 is disposed and a surface of the wiring layer 30 farthest from the support 40, is denoted as distance T2. According to the first embodiment, a difference between distances T1 and T2, that is T2–T1, may be in the range of 1 µm to 10 µm or may be in the range of 1 µm to 5 µm. The wiring layer 30 is directly disposed on the semiconductor chip 1 so as to decrease the difference T2–T1, thereby contributing to size reduction of the semiconductor package that incorporates the semiconductor chip 1 therein.

The support 40 may be a semiconductor element on which a rewiring layer is formed or may be a circuit board. Examples of the semiconductor element include a non-volatile or volatile memory chip. The non-volatile memory chip is a semiconductor chip from which data can be read and to which data can be written. Examples of the non-volatile memory chip include a NAND memory chip, a phase change memory chip, a resistance change memory chip, a ferroelectric memory chip, a magnetic memory chip, and the like. Examples of the volatile memory chip include a dynamic random-access memory (DRAM) and the like. The semiconductor element is not limited to a memory chip.

The support 40 comprises the electrode 41 electrically connected to the semiconductor element and internal wiring. The semiconductor chip 1 and the support 40 are electrically connected to each other via the wiring layer 30, which connects the electrode 12 of the semiconductor chip 1 and the electrode 41 of the support 40.

Figure 6:
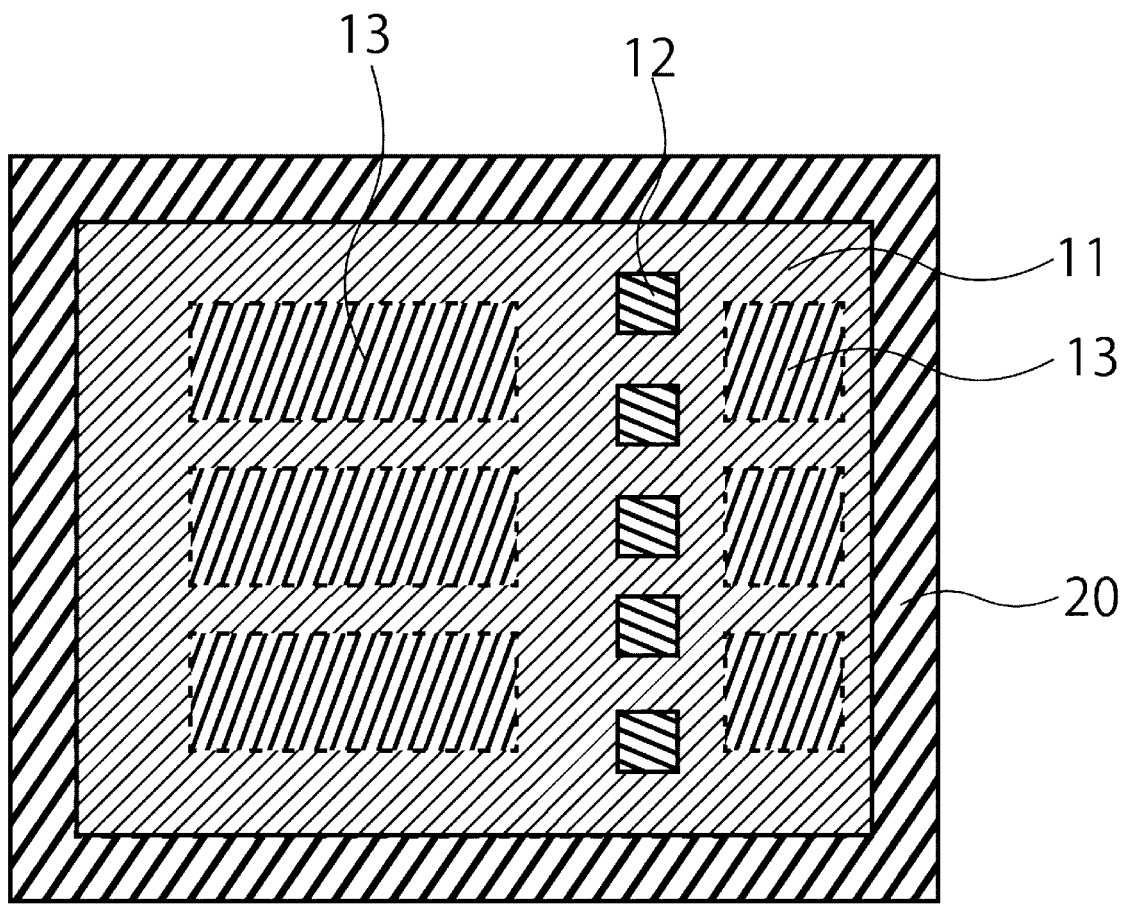
FIG. 6 depicts part of a semiconductor device in a manufacturing process according to the first embodiment.
Figure 7:
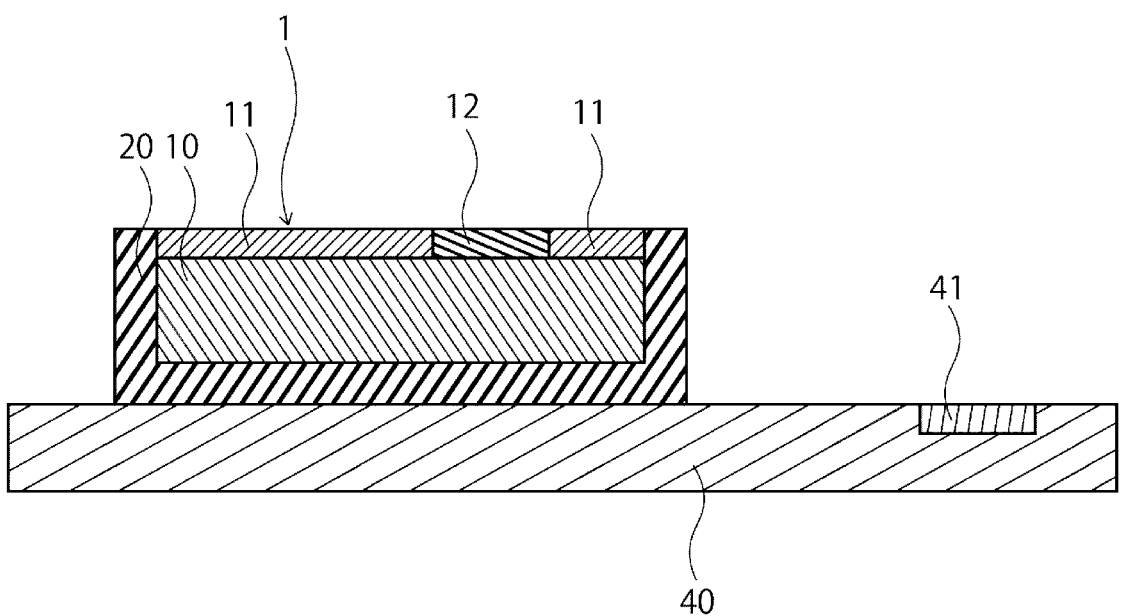
FIG. 7 depicts part of a semiconductor device in a manufacturing process according to the first embodiment.
Figure 8:
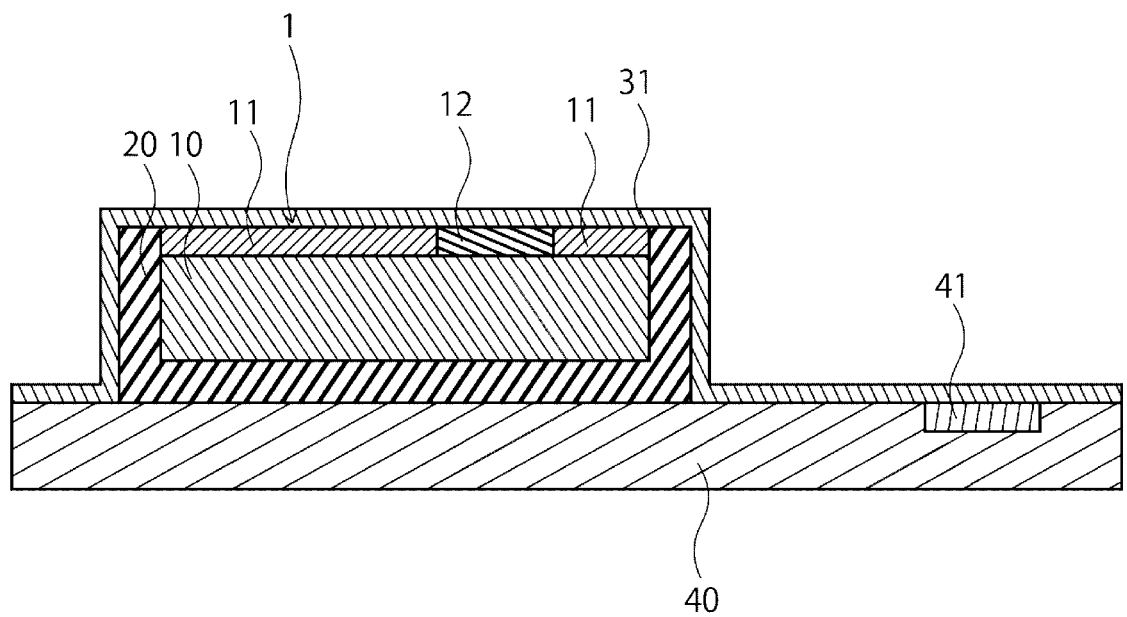
FIG. 8 depicts part of a semiconductor device in a manufacturing process according to the first embodiment.
Figure 9:
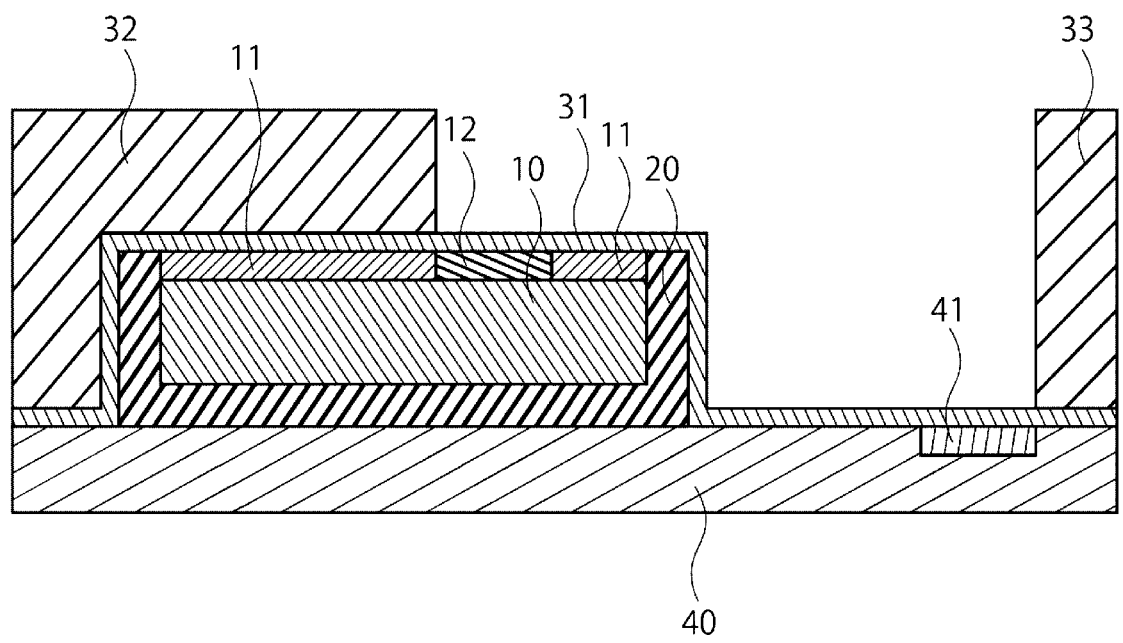
FIG. 9 depicts part of a semiconductor device in a manufacturing process according to the first embodiment.
Figure 10:
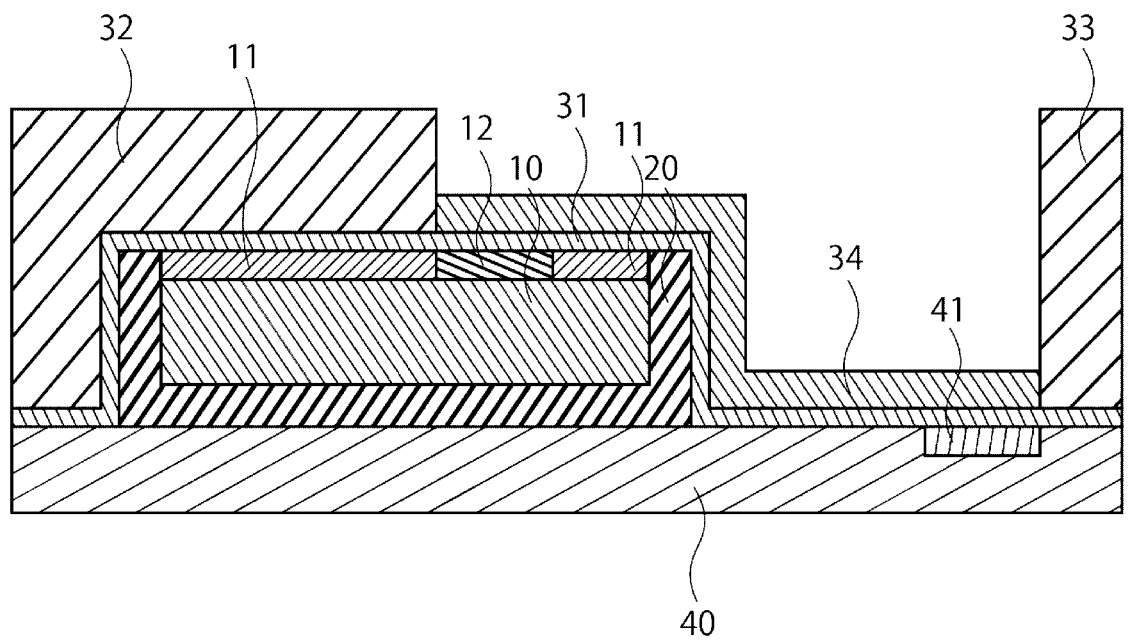
FIG. 10 depicts part of a semiconductor device in a manufacturing process according to the first embodiment.

Next, referring to conceptual process diagrams associated with the fabrication of the semiconductor device 100 in FIG. 2 to FIG. 10, a manufacturing method of the semiconductor device 100 in FIG. 1 according to one or more embodiments will be described. The manufacturing method of the semiconductor device 100 includes: a process of forming an insulator 21 (including an insulator 22 shown in FIG. 4 in this context) over a supporting substrate 50, on which a plurality of semiconductor chips 1 are disposed, in such a manner that the insulator 21 covers outer surfaces of each of the semiconductor chips 1, the outer surfaces including a surface facing away from the supporting substrate 50 side and also side surfaces of each semiconductor chip 1 (FIGS. 2-4); a process of cutting the insulator 21 between the semiconductor chips 1 to separate the neighboring semiconductor chips 1 in such a manner that each semiconductor chip 1 comprises the first insulating film 20 surrounding the outer surfaces thereof (FIG. 5); a process of detaching the respective semiconductor chips 1 from the supporting substrate 50 (FIG. 6); a process of disposing each of the detached semiconductor chips 1 on a support 40 in an upside-down manner, that is in a manner that the first insulating film 20 on the surface of the semiconductor chip 1 that is opposite to the surface on the supporting substrate 50 side faces the support 40 (FIG. 7); and a process of forming the wiring layer 30 in such a manner that the wiring layer 30 is in contact with: the surface of the semiconductor chip facing away from the support 40 side; the surface of the first insulating film 20 that is on a side surface side of the semiconductor chip 1; and the support 40 (FIGS. 8-10). In the process of cutting the insulator 21 between the neighboring semiconductor chips 1, part of the insulator 21 remains at least along the surface of the semiconductor chip 1 that is opposite to the surface on the supporting substrate 50 side and the side surfaces of the semiconductor chip 1, thereby forming the first insulating film 20 in contact with these surfaces (FIG. 5).

Figure 2:
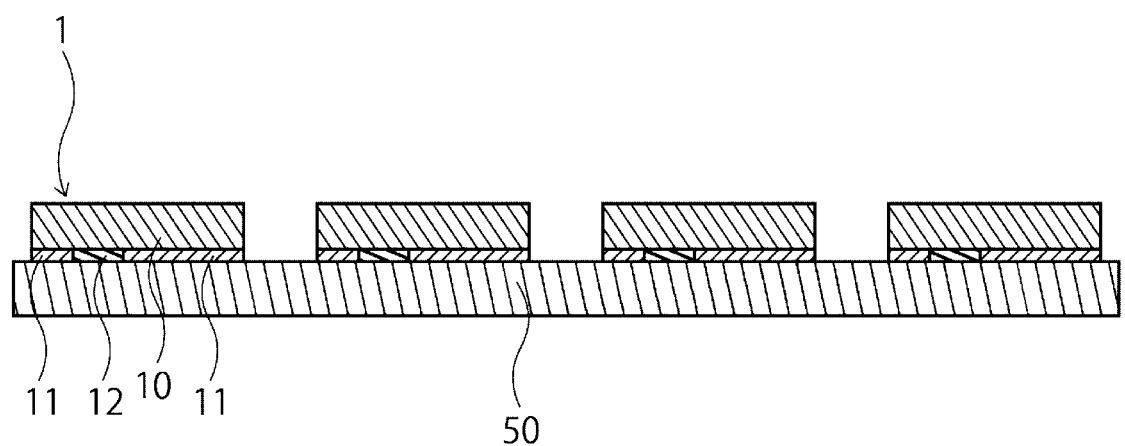
FIG. 2 depicts aspects of a semiconductor device during a manufacturing process according to a first embodiment.

As illustrated in FIG. 2, the plurality of semiconductor chips 1 are disposed on a supporting substrate 50 made of, for example, a silicon wafer in such a manner that the second insulating film 11 and electrode 12 side of each of the semiconductor chips 1 faces the supporting substrate 50. Each semiconductor chip 1 comprises a second insulating film 11 and a plurality of electrodes 12, which face the supporting substrate 50 when disposed thereon. Gaps are provided between the neighboring semiconductor chips 1. The supporting substrate 50 may be, for example, a glass substrate or a resin substrate. The supporting substrate 50 may be an adhesive resin substrate, and the semiconductor chips 1 may be directly adhered to the adhesive resin substrate. When the supporting substrate 50 is not adhesive, an adhesive member may be formed between the semiconductor chips 1 and the supporting substrate 50.

Figure 3:
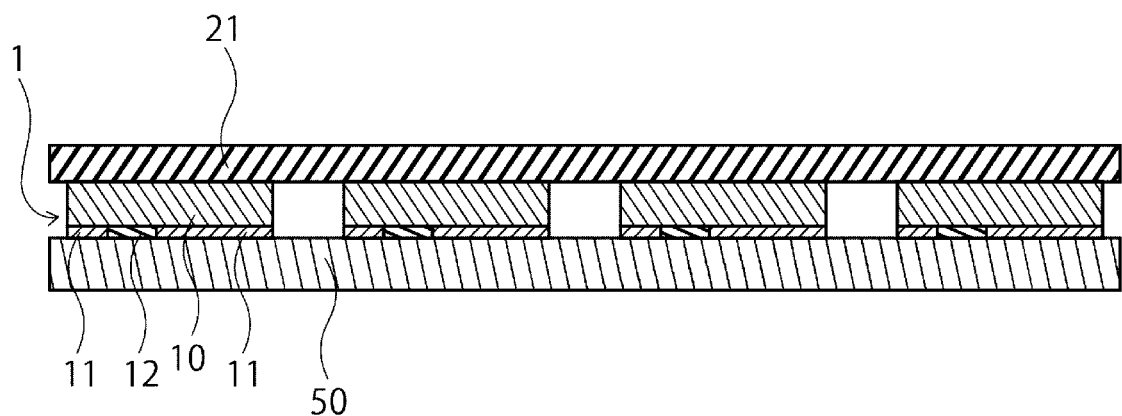
FIG. 3 depicts part of a semiconductor device in a manufacturing process according to the first embodiment.

Next, as illustrated in FIG. 3, the insulator 21 is formed on the upper surfaces of the semiconductor chips 1. The insulator 21 is, for example, a resin film.

Figure 4:
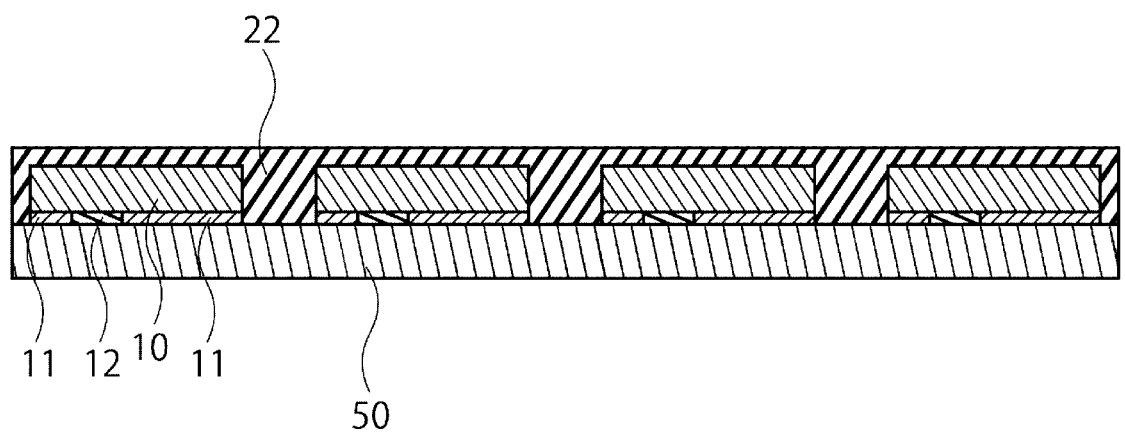
FIG. 4 depicts part of a semiconductor device in a manufacturing process according to the first embodiment.
Figure 5:
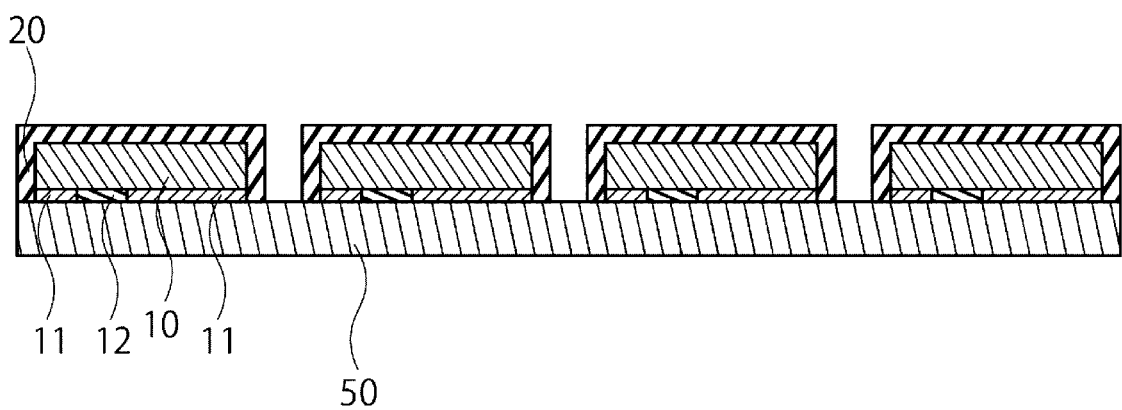
FIG. 5 depicts part of a semiconductor device in a manufacturing process according to the first embodiment.

Next, as illustrated in FIG. 4, the insulator 21 is pressed to fill the gaps between the semiconductor chips 1 to form the insulator 22 that cover the side surfaces of each of the semiconductor chips 1. The insulator 22 is in direct contact with the side surfaces of the semiconductor chips 1. In one embodiment, the entirety of the side surfaces of the semiconductor chips 1 are covered with the insulator 22 formed by, for example, one of the following methods: pressing the insulator 21 while under reduced pressure (such as in a vacuum); pressing the insulator 21 while heating the insulator 21; and pressing the insulator 21 under reduced pressure while heating the insulator 21.

Next, as illustrated in FIG. 5, the insulator 22 between the semiconductor chips 1 is cut/diced to separate the neighboring semiconductor chips 1 in such a manner that each of the separated semiconductor chips 1 comprises the first insulating film 20 surrounding the outer surfaces thereof. The first insulating film 20 is continuous and contacts: the surface of the semiconductor chip 1 facing away from the supporting substrate 50 side; and each side surface of the semiconductor chip 1. Cutting is performed by, for example, laser or blade dicing. In one embodiment, cutting into the supporting substrate 50 may be performed as well.

Next, each of the separate semiconductor chips 1 is detached from the supporting substrate 50. FIG. 6 is a conceptual plan view of a semiconductor chip 1 as detached. As illustrated in FIG. 6, all side surfaces of the semiconductor chip 1 are surrounded by the first insulating film 20. As illustrated in FIG. 7, the detached semiconductor chip 1 is subsequently disposed on the support 40 in such a manner that the first insulating film 20 that was on the upper surface of the semiconductor chip 1 when the semiconductor chip 1 was on the supporting substrate 50 now faces (contacts) the support 40. The electrode 41 to be electrically connected to the semiconductor chip 1 is disposed in or on the support 40. In FIG. 7 to FIG. 10, illustration of the semiconductor elements 13 is omitted for simplicity.

Next, as illustrated in FIG. 8, an under layer 31 for plating is deposited over the support 40 and the semiconductor chip 1 by, for example, CVD or sputtering.

Next, as illustrated in FIG. 9, resists 32 and 33 serving as plating masks are formed at positions where the wiring layer 30 is not to be formed. Then, electrolytic plating is performed to form a Cu layer 34 on the exposed under layer 31 as illustrated in FIG. 10.

Finally, the resists 32 and 33 and the under layer 31 under the resists 32 and 33 are removed so that the semiconductor device 100 as shown in FIG. 1 is obtained. The wiring layer 30 in this example is a film consisting of the under layer 31 and the Cu layer 34 stacked on each other. The manufacturing processes of the semiconductor device 100 having the configuration according to the first embodiment does not require a process of forming a separate insulating film between the first insulting film 20 and the wiring layer 30; hence, the semiconductor device 100 according to the present embodiment is also advantageous in simplifying the manufacturing method.

Figure 11:
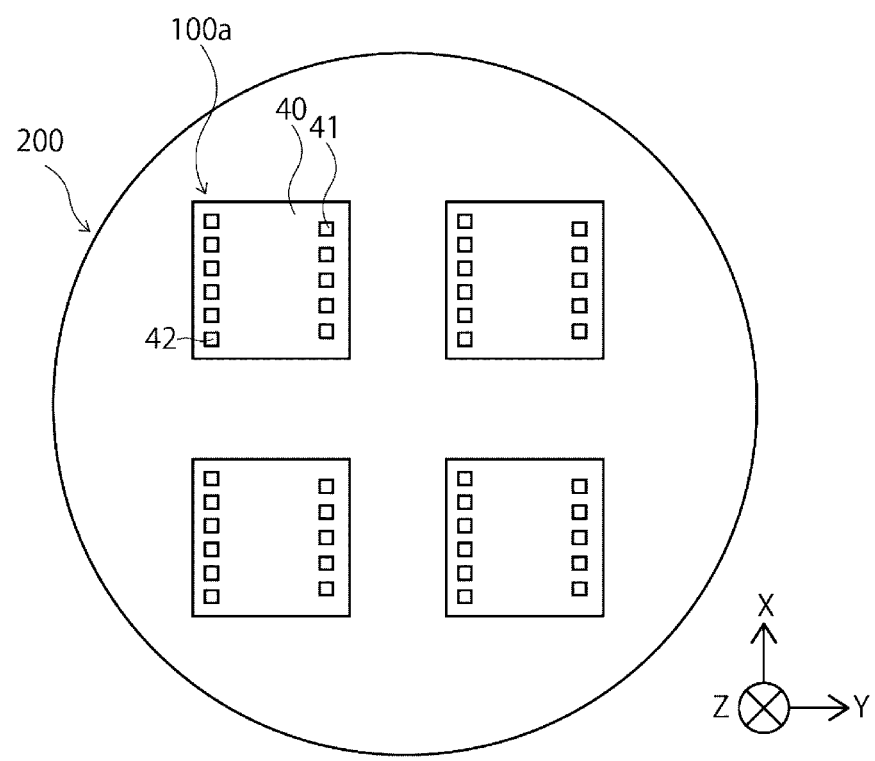
FIG. 11 depicts a semiconductor device in a conceptual plan view according to the first embodiment.

A case of forming the semiconductor device 100 on a wafer will be described. As illustrated in FIG. 11, a plurality of semiconductor elements 100a are formed on a wafer 200. The semiconductor elements 100a may be, for example, non-volatile or volatile memory elements, CMOS circuits, and the like. The plurality of semiconductor elements 100a are arranged side by side on the wafer 200. A plurality of electrodes 41 and a plurality of electrodes 42 are formed on a surface of each of the semiconductor elements 100a. The electrodes 41 and 42 are to be electrically connected to each other via components, such as a rewiring layer, formed on the surface of the semiconductor element 100a and/or internal wiring of the semiconductor element 100a. The electrodes 41 are used for connection to the semiconductor chip 1 whereas the electrodes 42 are used for connection to other semiconductor chips.

Figure 12:
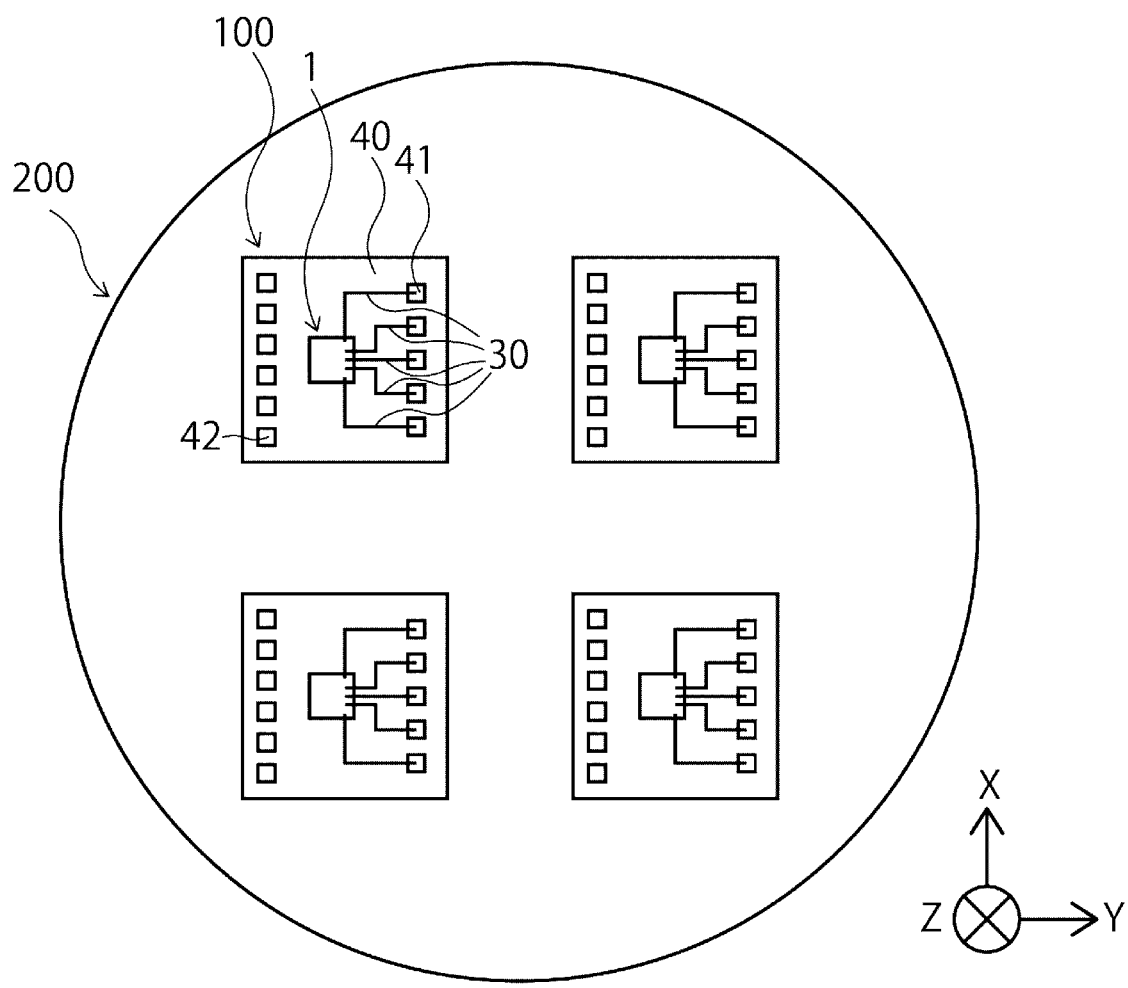
FIG. 12 depicts a semiconductor device in a conceptual plan view according to the first embodiment.

FIG. 12 depicts a state where the semiconductor chip 1 illustrated in FIG. 6 has been disposed on each of the semiconductor elements 100a and the semiconductor chip 1 is connected with the electrodes 41 via the wiring layers 30. In the example of FIG. 12, the wiring layer(s) 30 extend from three of the four side surfaces of the semiconductor chip 1 to the corresponding electrodes 41. In other examples, the wiring layer or layers 30 may be formed to extend from all of the four side surfaces of the semiconductor chip 1, or from two of the four side surfaces, or from only one of the four side surfaces. A pattern layout of the wiring layer 30 may be arbitrarily determined. For example, if the semiconductor chip 1 is not rectangular but polygonal, the wiring layer or layers 30 may be formed to extend from one or more of the side surfaces of the polygonal semiconductor chip 1. Finally, by cutting/dicing the wafer 200 along an outer perimeter of the semiconductor element 100a, the semiconductor device 100 is formed.

Figure 13:
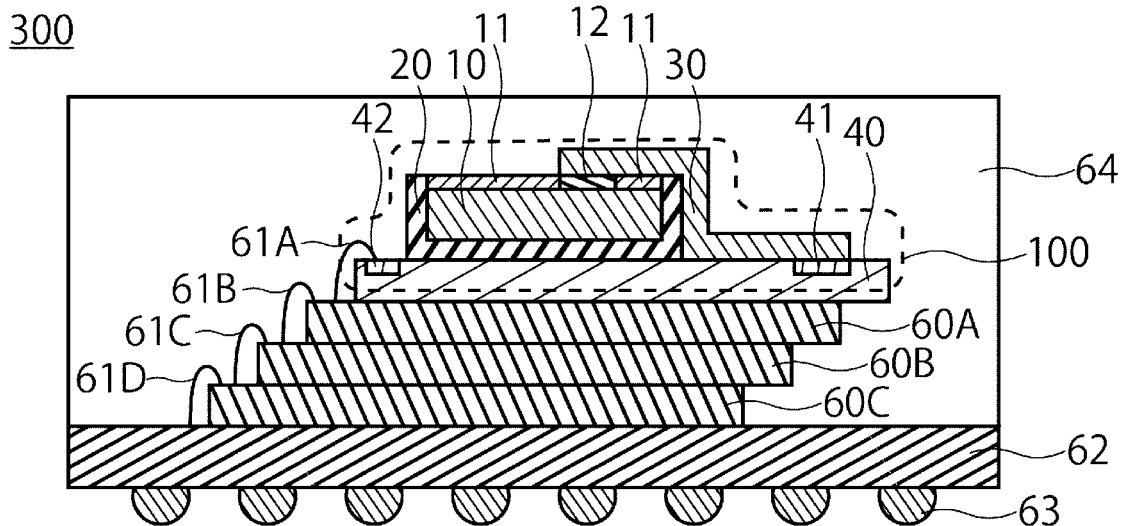
FIG. 13 depicts a semiconductor package in a conceptual cross-sectional view according to an embodiment.

FIG. 13 illustrates a semiconductor package 300 comprising the thus-formed semiconductor device 100. The semiconductor package 300 includes the semiconductor device 100, a plurality of NAND flash memory chips 60A to 60C (may also be collectively referred to as NAND flash memory chips 60), bonding wires 61A to 61D, a circuit board 62, solder balls 63, and an encapsulating material 64. In the semiconductor package 300, the plurality of NAND flash memory chips 60 are stacked on the circuit board 62, and the semiconductor device 100 is disposed on the NAND flash memory chips 60. The support 40 of the semiconductor device 100 may be another NAND flash memory chip. The electrode 12 and the electrode 41 are connected to each other by the wiring layer 30. The electrode 42 of the support 40is connected to a pad electrode of the NAND flash memory chip 60A with the bonding wire 61A. Adjacent pairs of the NAND flash memory chips 60 are connected to each other with the bonding wires 61B and 61C. The lowermost NAND flash memory chip 60C is connected to the circuit board 62 with the bonding wire 61D. When the semiconductor device 100 according to the first embodiment is used for the semiconductor package 300, the total thickness of the semiconductor package 300 can be reduced.

Second Embodiment

Figure 14:
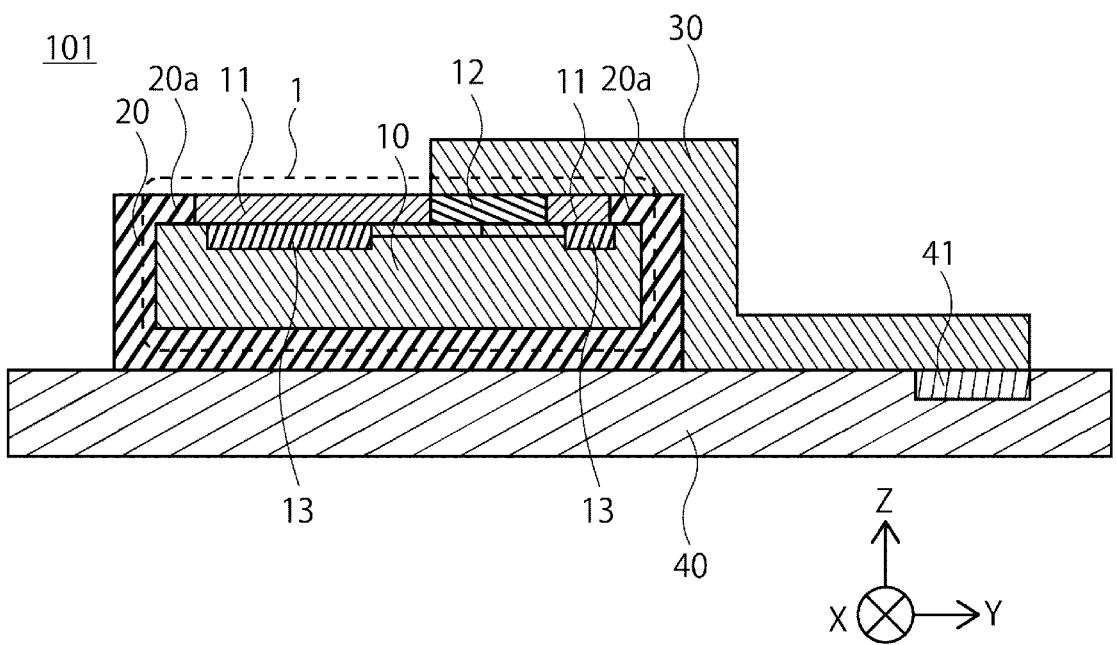
FIG. 14 a semiconductor device in a conceptual cross-sectional view according to a second embodiment.

A semiconductor device 101 according to the second embodiment is a modification of the semiconductor device 100 according to the first embodiment. The contents of the second embodiment in common with the first embodiment will not be explained again. FIG. 14 is a conceptual cross-sectional view of the semiconductor device 101 according to the second embodiment.

In the semiconductor device 101 according to the second embodiment, a portion 20a of the first insulating film 20 is disposed on part of the second surface of the semiconductor chip 1 facing away from the support 40 side. The portion 20a of the first insulating film 20 makes the insulation between the semiconductor chip 1 and the wiring layer 30 further enhanced even if metal is exposed from the second surface of the semiconductor chip 1.

Next, referring to FIG. 15 to FIG. 19, a device manufacturing method of the semiconductor device 101 will be described.

Figure 15:
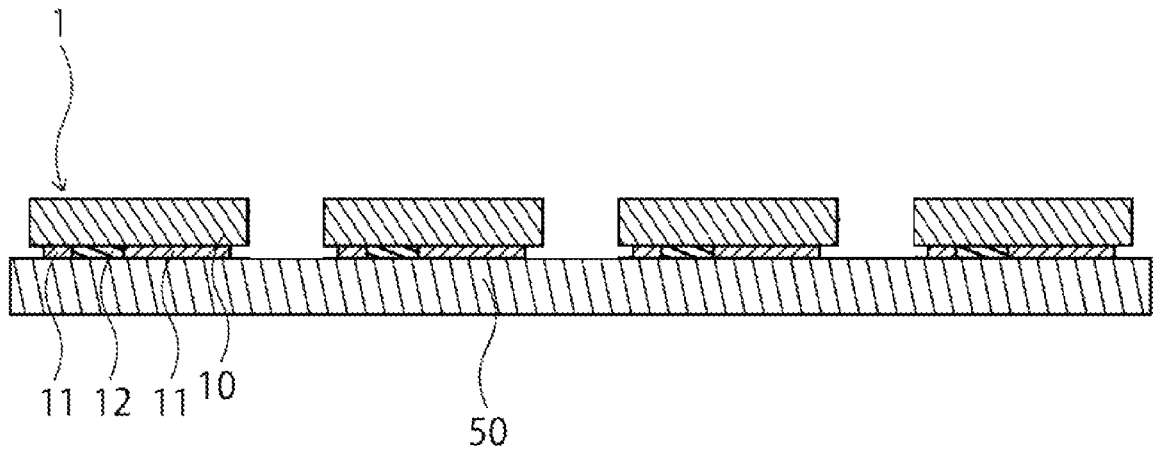
FIG. 15 depicts part of a semiconductor device in a manufacturing process according to the second embodiment.

First, as illustrated in FIG. 15, a plurality of semiconductor chips 1 are disposed on the supporting substrate 50 made of, for example, a wafer in such a manner that the second insulating film 11 and electrode 12 side of the semiconductor chips 1 faces the supporting substrate 50. Gaps are left between the neighboring semiconductor chips 1. Each semiconductor chip 1 comprises a semiconductor layer 10, and part of the semiconductor layer 10 facing the supporting substrate 50 is left exposed/uncovered by insulating film 11 and any electrode 12.

Figure 16:
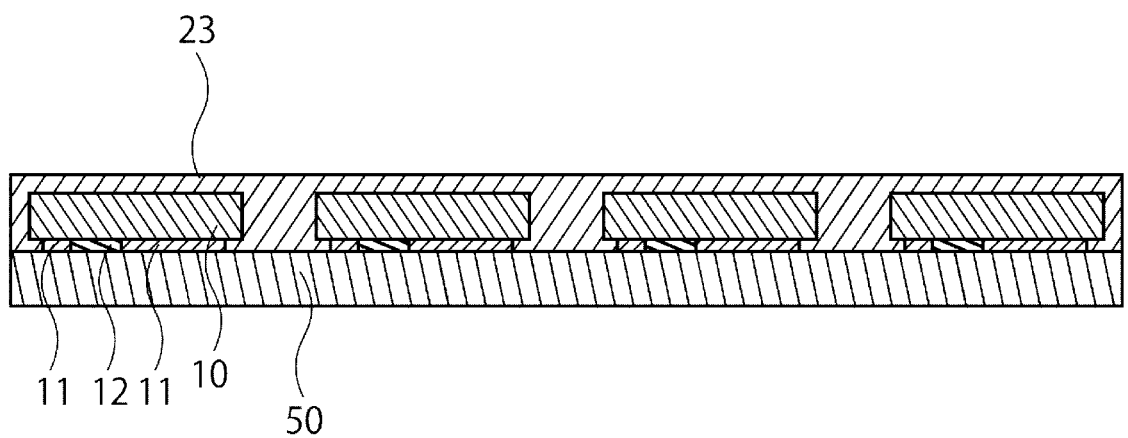
FIG. 16 depicts part of a semiconductor device in a manufacturing process according to the second embodiment.

Next, as illustrated in FIG. 16, the surface of the semiconductor chip 1 facing away from supporting substrate 50 side is coated with a liquid or gel resin composite 23. In one embodiment, pressure reduction (vacuum) may be utilized so as not to form any voids in the resin material. The resin composite 23 may be a material that cures by, for example, drying, heating, or UV irradiation.

Figure 17:
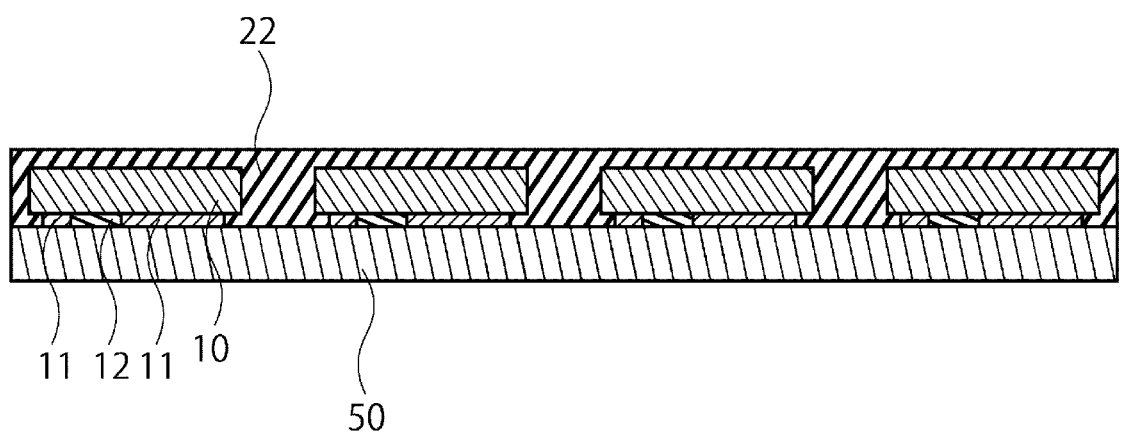
FIG. 17 depicts part of a semiconductor device in a manufacturing process according to the second embodiment.

Next, as illustrated in FIG. 17, the resin composite 23 is dried, heated, or UV irradiated to obtain cured insulator 22.

Figure 18:
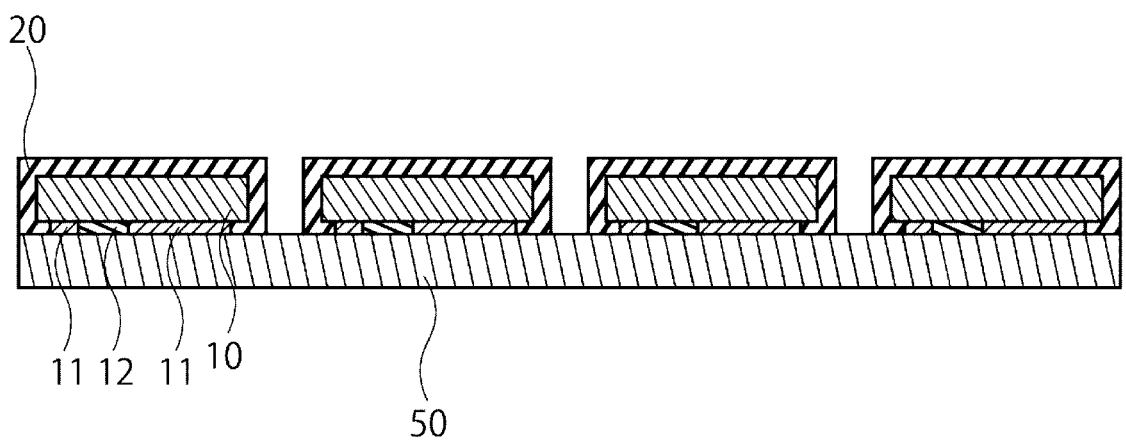
FIG. 18 depicts part of a semiconductor device in a manufacturing process according to the second embodiment.

Next, as illustrated in FIG. 18, the cured insulator 22 between the neighboring semiconductor chips 1 is cut such that the first insulating film 20 is formed surrounding the outer surfaces of the semiconductor chip 1 or the semiconductor layer 10 thereof. The thus-formed first insulating film 20 is in continuous (unbroken) contact with: the surface of the semiconductor chip 1 facing away from the supporting substrate 50 side; and the side surfaces of the semiconductor chip 1. A portion 20a (see FIG. 19) of the first insulating film 20 is also in direct contact with the semiconductor layer 10.

Figure 19:
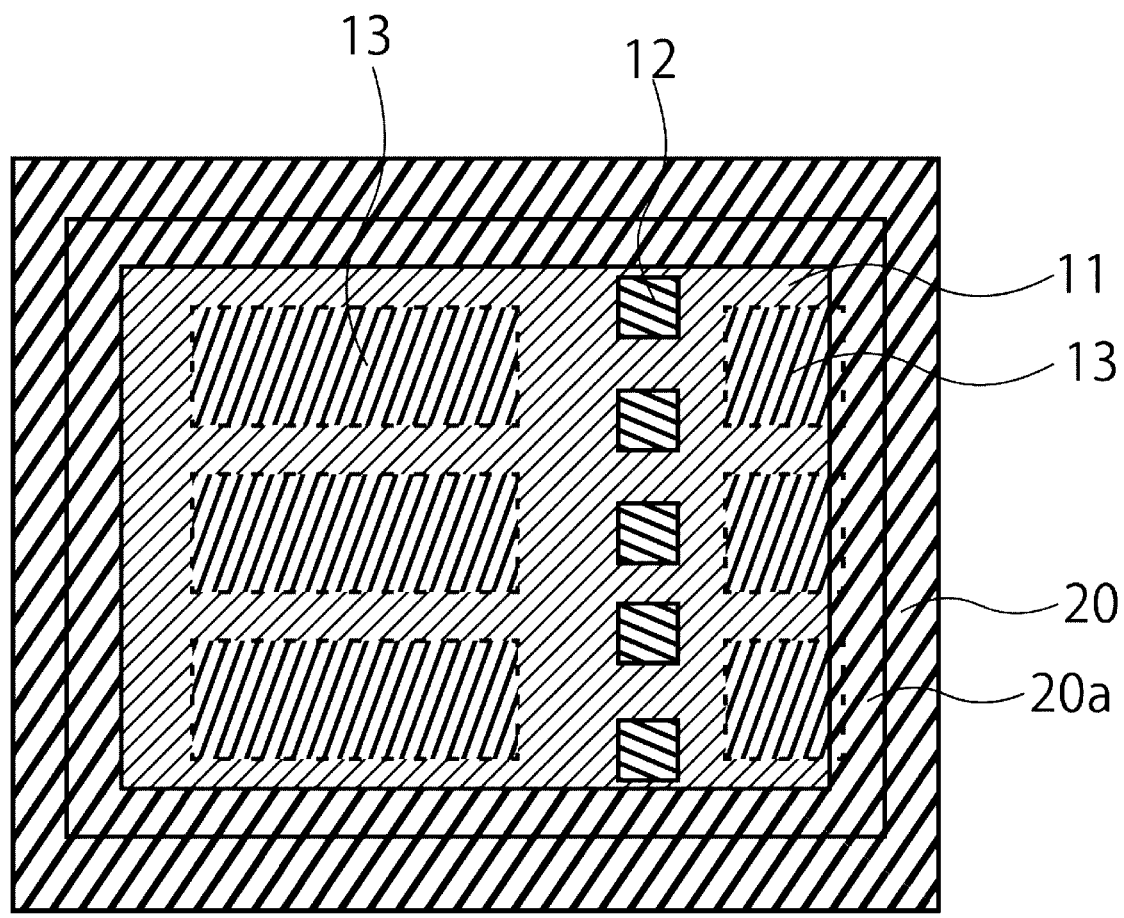
FIG. 19 depicts part of a semiconductor device in a manufacturing process according to the second embodiment.

FIG. 19 depicts the detached semiconductor chip 1 as viewed from above. As illustrated in FIG. 18, the side surfaces of the semiconductor layer 10 indicated with dotted lines are surrounded by the first insulating film 20. The portion 20a of the first insulating film 20 is formed on a slightly inner side of an external contour of the semiconductor layer 10. The first insulating film 20 is also formed on part of upper surfaces of the semiconductor elements 13. Subsequently, substantially the same processes as those of the manufacturing method in the first embodiment are performed to obtain the semiconductor device 101.

Aspects of the manufacturing method according to the second embodiment maybe adopted for, or combined with, the manufacturing method according to the first embodiment, and vice versa.

Figure 20:
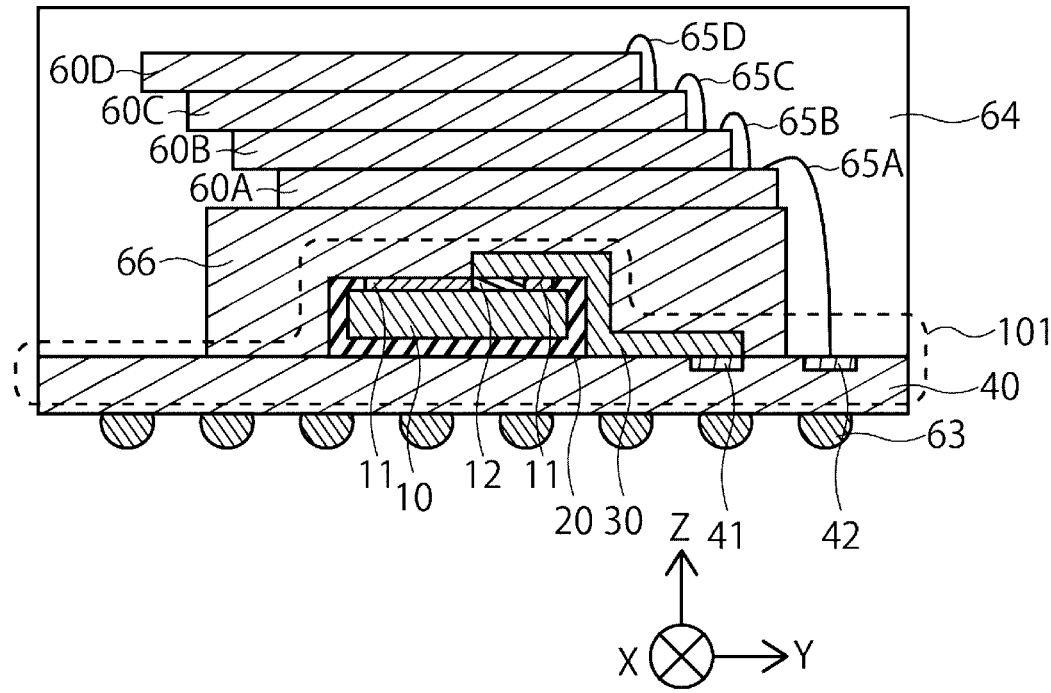
FIG. 20 depicts a semiconductor package in a conceptual cross-sectional view according to an embodiment.

FIG. 20 illustrates a semiconductor package 400 comprising the thus-formed semiconductor device 101. The semiconductor package 400 includes the semiconductor device 101, the support 40, a plurality of NAND flash memory chips 60A to 60D (may also be collectively referred to as NAND flash memory chips 60), bonding wires 65A to 65D, an adhesive layer 66, the solder balls 63, and the encapsulating material 64. The support 40 in the present example is a circuit board. In the semiconductor package 400, the semiconductor chip 1 of the semiconductor device 101 is covered with the adhesive layer 66. The plurality of NAND flash memory chips 60 are stacked on the adhesive layer 66. The lowermost NAND flash memory chip 60A is connected to the support 40 with the bonding wire 65A, and adjacent pairs of the NAND flash memory chips 60 are connected to each other with the bonding wires 65B, 65C, 65D. The electrode (or first electrode) 41 and a pad electrode 42 of the support 40 are electrically connected to each other with components such as internal wiring of the support 40. The pad electrode 42 is connected to the solder balls 63 and the bonding wire 65A.

When the semiconductor device 101 according to the second embodiment is used for the semiconductor package 400, the adhesive layer 66 can be thinned to reduce a thickness of the semiconductor package 400.

Third Embodiment

Figure 21:
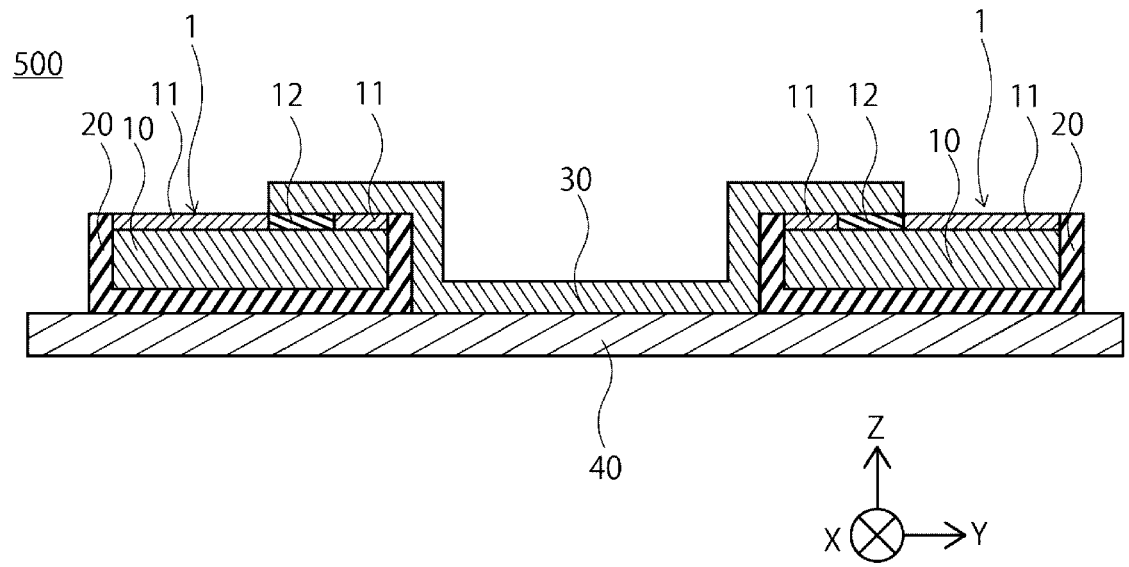
FIG. 21 depicts a semiconductor device in a conceptual cross-sectional view according to a third embodiment.

A semiconductor device according to the third embodiment is a modification of the semiconductor devices 100 and 101 according to the first and second embodiments. The aspects of the third embodiment in common with the first and second embodiments will not be explained again. FIG. 21 is a conceptual diagram illustrating a semiconductor device 500 according to the third embodiment.

The semiconductor device 500 according to the third embodiment is different from the first and second embodiments in that two semiconductor chips 1 are disposed on the support 40 and these two semiconductor chips 1 are connected to each other with the wiring layer 30.

In the first and second embodiments, the semiconductor chip 1) would generally be connected to a different semiconductor chip only when the other semiconductor chip is on a separate support from support 40. However, the wiring configuration according to the third embodiment may be adopted to mutually connect a plurality of semiconductor chips 1 on the support 40. For example, if a plurality of logic chips are disposed on the support 40 and connected to each other in substantially the same manner as the semiconductor device 500, a high-speed large-scale logic IC can be obtained.

Other Embodiments (a) While in the first, second, and third embodiments, the wiring layer 30 is made of a metal layer, an insulating film, such as a resin film and an inorganic film, may be further formed on the metal layer. This way, the wiring layer 30 can be protected by the insulating film to improve reliability.

(b) In the embodiment (a), two different metal layers may be provided by disposing another metal layer on the insulating film formed on the wiring layer 30. A plurality of wiring layers 30 may be further stacked by alternating metal layers and insulating films using, for example, photolithography and etching to pattern individual wiring layers before forming the next. This makes it possible to form wiring layers 30 of further various wiring patterns.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a support comprising a first electrode;
a semiconductor chip having a first surface facing the support and a second surface facing away from the support, the semiconductor chip including a second electrode on the second surface;
a first insulating film having a first portion in contact with the first surface and a second portion in contact with at least one side surface of the semiconductor chip; and
a wiring layer connecting the first electrode to the second electrode, the wiring layer being on the support, the second surface of the semiconductor chip, and a side surface of the second portion of the first insulating film, wherein
the first and second portions of the first insulating film have the same material composition.

2. The semiconductor device according to claim 1, wherein the support is a circuit board.

3. The semiconductor device according to claim 1, further comprising:
a second insulating film on the second surface of the semiconductor chip, wherein
the wiring layer is in contact with the second insulating film.

4. The semiconductor device according to claim 1, wherein first insulating film is continuous from the first portion to the second portion.

5. The semiconductor device according to claim 1, wherein the first insulating film extends over a part of the second surface of the semiconductor chip.

6. The semiconductor device according to claim 1, wherein the first insulating film contacts all side surfaces of the semiconductor chip.

7. The semiconductor device according to claim 1, wherein the support includes a semiconductor element therein.

8. The semiconductor device according to claim 1, wherein the first insulating film is in direct contact with both the first surface and the at least one side surface of the semiconductor chip.

9. The semiconductor device according to claim 8, wherein the first insulating film is in direct contact with the support.

10. The semiconductor device according to claim 1, wherein the first insulating film comprises an adhesive resin.

11. The semiconductor device according to claim 1, wherein the wiring layer is in direct contact with the semiconductor chip, the first insulating film, and the support.

12. The semiconductor device according to claim 1, wherein the first insulating film is a single, continuous film.

13. The semiconductor device according to claim 1, wherein all portions of the first insulating film have the same composition as one another.

14. The semiconductor device according to claim 1, wherein the first insulating film is a seamless continuous film connecting the first portion to the second portion.

15. A semiconductor device, comprising:
- a support comprising a first electrode;
- a semiconductor chip on the support, the semiconductor chip having a first surface facing the support and a second surface facing away from the support, the semiconductor chip including a second electrode on the second surface;
- a first insulator film in direct contact with the first surface and side surfaces of the semiconductor chip;
- a second insulator film in direct contact with the second surface of the semiconductor chip; and
- a wiring layer in direct contact with first electrode, the second electrode, the first insulator film, the second insulator film, and the support, wherein
- a first portion of the first insulator film is in direct contact with the first surface,
- a second portion of the first insulator film is in direct contact with the side surfaces of the semiconductor chip, and
- the first and second portions of the first insulator film have the same composition.

16. The semiconductor device according to claim 15, wherein the second insulator film covers the entire second surface of the semiconductor chip excepting for a part of the second surface on which the second electrode is disposed.

17. The semiconductor device according to claim 15, wherein the first insulator film extends on a part of the second surface of the semiconductor chip.

18. The semiconductor device according to claim 15, wherein the first and second portions of the first insulator film are formed at the same time in the same process.

19. The semiconductor device according to claim 15, wherein all portions of the first insulator film have the same composition as one another.

20. The semiconductor device according to claim 15, wherein the first insulator film is a seamless continuous film connecting the first portion to the second portion.

* * * * *